United States Patent [19]
Essenwanger

[11] Patent Number: 5,663,728
[45] Date of Patent: Sep. 2, 1997

[54] DIGITAL-TO-ANALOG CONVERTED (DAC) AND METHOD THAT SET WAVEFORM RISE AND FALL TIMES TO PRODUCE AN ANALOG WAVEFORM THAT APPROXIMATES A PIECEWISE LINEAR WAVEFORM TO REDUCE SPECTRAL DISTORTION

[75] Inventor: Kenneth A. Essenwanger, Walnut, Calif.

[73] Assignee: Hughes Aircraft Company, Los Angeles, Calif.

[21] Appl. No.: 443,995

[22] Filed: May 18, 1995

[51] Int. Cl.⁶ .................................................. H03M 1/80
[52] U.S. Cl. ........................... 341/153; 341/154; 341/145
[58] Field of Search .................................. 341/133, 134, 341/135, 144, 145, 153, 154

[56] References Cited

U.S. PATENT DOCUMENTS

| | | | |
|---|---|---|---|
| 4,056,740 | 11/1977 | Schoeff | 307/362 |
| 4,092,639 | 5/1978 | Schoeff | 340/347 |
| 4,408,190 | 10/1983 | Nagano | 340/347 |
| 4,430,641 | 2/1984 | Baur et al. | |
| 4,686,511 | 8/1987 | Koen | 340/347 |
| 4,862,170 | 8/1989 | Hashimoto et al. | |
| 4,975,699 | 12/1990 | Frey | 341/118 |
| 5,061,445 | 10/1991 | Zoski et al. | |
| 5,198,814 | 3/1993 | Ogawara et al. | 341/118 |
| 5,345,234 | 9/1994 | Stewart et al. | 341/108 |

FOREIGN PATENT DOCUMENTS

WO92/22060  12/1992  WIPO.

OTHER PUBLICATIONS

Kamoto et al., "An 8–bit 2–ns Monolithic DAC", *IEEE Journal of Solid–State Circuits*, vol. 23, No. 1, Feb. 1988, pp. 142–146.

Douglas Mercer, "A 16–b D/A Converter with Increased Spurious Free Dynamic Range", *IEEE Journal of Solid–State Circuits*, vol. 29, No. 10, Oct. 1994, pp. 1180–1185.

Nakamura et al., "A 10–b 70–MS/s CMOS D/A Converter", *IEEE Journal of Solid–State Circuits*, vol. 26, No. 4, Apr. 1991, pp. 637–642.

Hsieh et al., "A 12-bit 1–Gword/s GaAs Digital–to–Analog Converter System", *IEEE Journal of Solid–State Circuits*, vol. sc–22, No. 6, Dec. 1987, pp. 1048–1055.

Takakura et al., "A 10 bit 80 MHz Glitchless CMOS D/A Converter", *IEEE 1991 Custom Integrated Circuits Conference*, CH 2994–2, 1991, pp. 26.5.1–26.5.4.

Hsieh et al., "A GaAs 12–Bit Digital–To–Analog Converter", *IEEE GaAs IC Symposium*, Ch 2182–4, 1985, pp. 187–190.

Hawksford, "Digital–to–Analog Converter with Low Intersample Transition Distortion and Low Sensitivity to Sample Jitter and Transresistance Amplifier Slew Rate", *93rd Convention of the Audio Engineering Society*, San Francisco, CA, 1992 Oct. 1–4; revised 1994 Aug. 20, pp. 901–916.

*Primary Examiner*—Jeffrey A. Gaffin
*Assistant Examiner*—Jason H. Vick
*Attorney, Agent, or Firm*—G. S. Grunebach; M. W. Sales; W. K. Denson-Low

[57] ABSTRACT

A DAC converts a sequence of digital codewords into an approximately piecewise linear analog waveform that follows rising and falling edges between plateau levels. The DAC processes, in parallel, each bit of the codewords to produce component waveforms that are weighted according to their bits significance and summed together to produce the piecewise linear analog waveform. Waveform shaping circuits control the rise and fall times of each component waveform so that the analog waveform's rising and falling edges settle to within a desired error bound of a linear output ramp whose slope is a function of the difference between successive codewords and the rise or fall times. The rise and fall times are preferably approximately the same. Limiting switches control the plateau levels of the component waveforms so that the analog waveform's plateaus settle to within the desired error bound of the ideal values represented by the codewords. The linear region of the limiting switches are expanded to maintain the linearity of the rising and falling edges established by the waveform shaping circuits.

24 Claims, 9 Drawing Sheets

DIGITAL-TO-ANALOG CONVERTED (DAC) AND METHOD THAT SET WAVEFORM RISE AND FALL TIMES TO PRODUCE AN ANALOG WAVEFORM THAT APPROXIMATES A PIECEWISE LINEAR WAVEFORM TO REDUCE SPECTRAL DISTORTION

BACKGROUND OF THE INVENTION

1. Field of the Invention

The present invention generally relates to digital-to-analog converters (DACs), and more specifically to a DAC that generates an approximately piecewise linear analog waveform with reduced spectral distortion and increased signal-to-quantization-noise ratio (SQNR).

2. Description of the Related Art

DACs are used to convert a sequence of digital codewords, where each codeword represents a quantized sample from an underlying analog waveform, into an analog voltage or current signal. In digital circuits each bit of the codeword is represented by a digital signal. In theory, these signals could be binary weighted, as a function of the bit's position, and summed together to produce the analog signal. However, the digital signals are only controlled with sufficient accuracy to switch the digital circuitry, and thus are not precise enough to accurately construct the analog signal. Instead, the digital signals are used to control electrical switches that switch between precision limited low and high signal levels. These signals are binary weighted and summed together to give the analog signal. As the speed of digital circuitry increases, the slew rate (switching speed) and accuracy of the switches become increasingly important factors in minimizing distortion of the analog signal.

FIG. 1 is a schematic diagram of a conventional DAC 10 that converts a sequence of n-bit binary codewords 12 into an analog voltage signal $V_O$. A clock 14 applies a clock signal 16 to a register 18 so that each codeword is read out in parallel. Register 18 produces n digital signals 20, one for each bit of codeword 12, that are applied to respective digitally controlled electrical switches $S_{N-1}, S_{N-2}, \ldots, S_0$ and held for a complete clock cycle. The codewords' most significant bits (MSBs) are applied to switch $S_{N-1}$ and their least significant bits (LSBs) are applied to switch $S_0$.

A reference voltage line $-V_R$ and a ground line GND are selectively applied through digitally controlled electrical switches $S_{N-1}, S_{N-2}, \ldots, S_0$ to respective binary weighted resistors $R_{N-1}, R_{N-2}, \ldots, R_0$. The resistors are connected in parallel to the inverting terminal 22 of an inverting operational amplifier (opamp) A1. The opamp's non-inverting terminal 24 is connected to ground, and a resistor $R_{out}$ is connected between inverting terminal 22 and opamp output 26. The negative feedback of opamp A1 holds the voltage at inverting terminal 22 at approximately ground potential.

When the MSB of codeword 12 is high, switch $S_{N-1}$ connects the reference voltage line $-V_R$ to resistor $R_{N-1}$, which causes a current $I_{N-1}$ to flow through it. Because the resistor values are binary weighted, i.e. $R_{N-1}=R$, $R_{N-2}=2R$, ..., and $R_0=2^{N-1}R$, the currents are related as $I_{N-1}=2I_{N-2}=\ldots 2^{N-1}I_0$ so that they reflect the significance of their associated bits. When the MSB is low, switch $S_{N-1}$ connects the ground line to resistor $R_{N-1}$ so that the voltage drop across resistor $R_{N-1}$ is ideally zero, and hence the current $I_{N-1}$ is zero. The currents $I_{N-1}, \ldots, I_0$ are summed at inverting terminal 22 to produce a current $I_{sum}$ that is proportional to codeword 12. $I_{sum}$ flows through $R_{out}$ and generates voltage $V_O$ at output 26.

Voltage signal $V_O$ is given by:

$$V_O = \left( a_{N-1} \frac{V_R}{R} + a_{N-2} \frac{V_R}{2R} + \ldots + a_1 \frac{V_R}{2^{N-2}R} + a_0 \frac{V_R}{2^{N-1}R} \right) R_{out} \quad (1)$$

where $a_{N-1}, \ldots, a_0$ are the binary coefficients for the MSB to the LSB and R is the resistance of $R_{N-1}$.

Factoring equation 1 gives:

$$V_0 = \left( a_{N-1} + \frac{1}{2} a_{N-2} + \ldots + \frac{1}{2^{N-2}} a_1 + \frac{1}{2^{N-1}} a_0 \right) \frac{V_R R_{out}}{R} \quad (2)$$

which shows that $V_O$ is proportional to the digital codeword 12.

As shown in FIG. 2, the ideal voltage signal $V_O$ is a zero-order-hold (ZOH) or stair-stepped waveform 28 with infinite slew rate (a discontinuity at the sampling instances) that represents the quantized samples 29 of an underlying analog waveform 30. The DAC's output voltage signal $V_O$ is filtered to produce a reconstructed analog waveform 32 that is a time-shifted approximation of the underlying waveform 30. For DAC 10 to produce an ideal ZOH waveform 28, the switches $S_{N-1}, \ldots S_0$ have to switch and settle between the desired plateau levels instantaneously. However, in practice switches can not switch instantly, and will overshoot and ring before settling to the plateau levels. Under conventional theory, the accuracy of DAC 10 depends upon how close the switches' actual transfer functions approximate ideal ZOH waveform 28.

As shown in FIG. 3, each switch $S_{N-1}, \ldots,$ and $S_0$ produces an output waveform 34 that follows a rising edge 36 at a finite slew rate, i.e. a non-zero rise time $T_{R1}$, overshoots the desired plateau level 38, and rings for a portion of the clock period T before settling to plateau level 38. The rise time $T_{R1}$ is defined as the time it takes for waveform 34 to rise from 10% to 90% of the difference between the high and low plateau levels. The slew rate is the ten-to-ninety percent change in the amplitude divided by rise time $T_{R1}$. Settling time $T_{S1}$ is the time it takes for waveform 34 to rise from the 10% level and settle to within a known error bound 40, suitably one-half of an LSB, from desired plateau level 38. In practice, each switch is designed to approximate an ideal ZOH waveform 42 by minimizing the settling time $T_{S1}$.

A well known approach for reducing settling time $T_{S1}$ is to reduce the switch's rise time $T_{R1}$. The switch's ringing is dampened by reducing its parasitic capacitance and inductance. However, manufacturing a switch with these characteristics is difficult and expensive. Furthermore, even though the switch's waveform 34 approximates the ZOH waveform 42 it would be preferable to reduce its spectral distortion even further.

Kamoto et al. "An 8-bit 2-ns Monolithic DAC," IEEE Journal of Solid-State Circuits, Vol. 23, No. 1, Feb. 1988, pp. 142–146 disclose a DAC that reduces the settling time $T_{S2}$ of its output waveform 44 (shown in FIG. 3) by controlling the switches' rise and fall times. For each codeword bit, a differential digital signal is applied through a control driver to a switch that is driven between precision limited low and high values. The control driver increases the digital signal's rise time, which has the effect of increasing the switch's rise time $T_{R2}$. This suppresses the ringing and reduces the settling time $T_{S2}$.

The control driver is adjusted externally to select the optimum rise time that minimizes settling time $T_{S2}$. Kamoto shows that when rise time $T_{R2}$ is too short, ringing is severe and settling time $T_{S2}$ is increased. However, if rise time $T_{R2}$ is too long settling time $T_{S2}$ will also be increased, and hence degrade waveform 44. At the optimum rise time, the countervailing interests of reducing the rise time and suppressing the ringing are balanced and thus provide the minimum settling time. Kamoto discloses optimum rise and fall times of approximately fifteen percent of the settling time.

Because Kamoto is trying to approximate ZOH waveform 42 the rise time, and hence slew rate, must remain relatively fast to construct the rising edge of the ZOH waveform. At these relatively large slew rates, high frequency parasitic effects cause the waveform's rising edge 46 to be non-linear. Furthermore, waveform 44 still overshoots the desired plateau value 38 and rings for a period of time. The non-linearity of rising edge 46 and the ringing in waveform 44 cause spectral distortion that would preferably be reduced.

SUMMARY OF THE INVENTION

The present invention provides a DAC and an associated conversion method with reduced spectral distortion and increased SQNR.

This is accomplished with a DAC that converts a sequence of digital codewords into an approximately piecewise linear analog waveform. The waveform follows rising and falling edges between plateau levels that approximate the ideal values of the digital codewords. The DAC processes, in parallel, each bit of the codewords to produce component waveforms that are weighted according to their bits' significance and summed together to produce the piecewise linear analog waveform.

Waveform shaping circuits control the rise and fall times of each component waveform so that the analog waveform's rising and falling edges settle to within a desired error bound of a linear output ramp whose slope is a function of the difference between successive codewords and the rise or fall times. The rise and fall times are preferably approximately the same. Limiting switches control the plateau levels of the component waveforms so that the analog waveform settles to within the desired error bound of the ideal values represented by the codewords. The linear operating region of the limiting switches is expanded to maintain the linearity of the rising and falling edges established by the waveform shaping circuits.

For a better understanding of the invention, and to show how the same may be carried into effect, reference will now be made, by way of example, to the accompanying drawings.

DETAILED DESCRIPTION OF THE INVENTION

Figure 1:
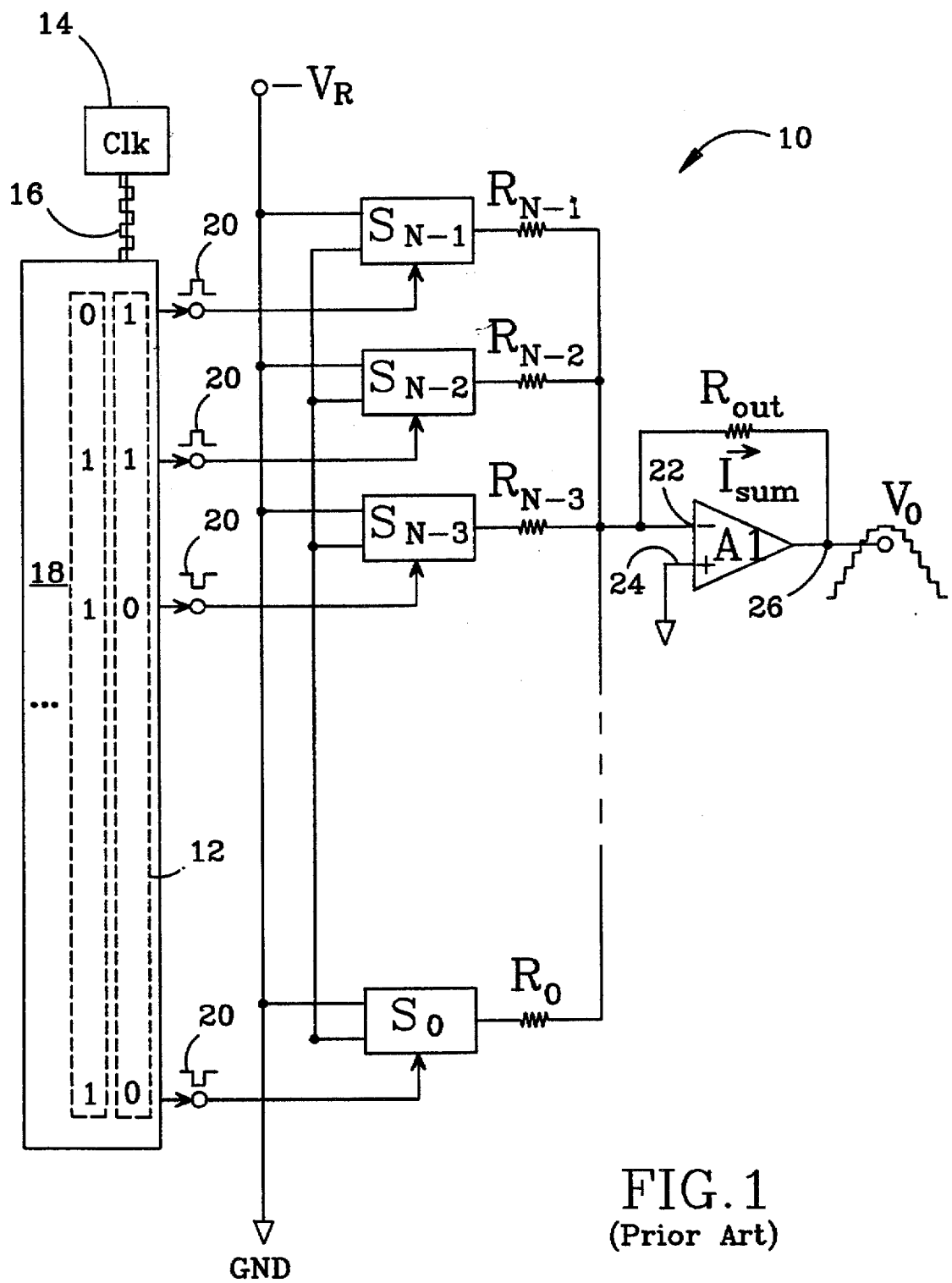
FIG. 1, described above, is a schematic diagram of a known DAC.
Figure 2:
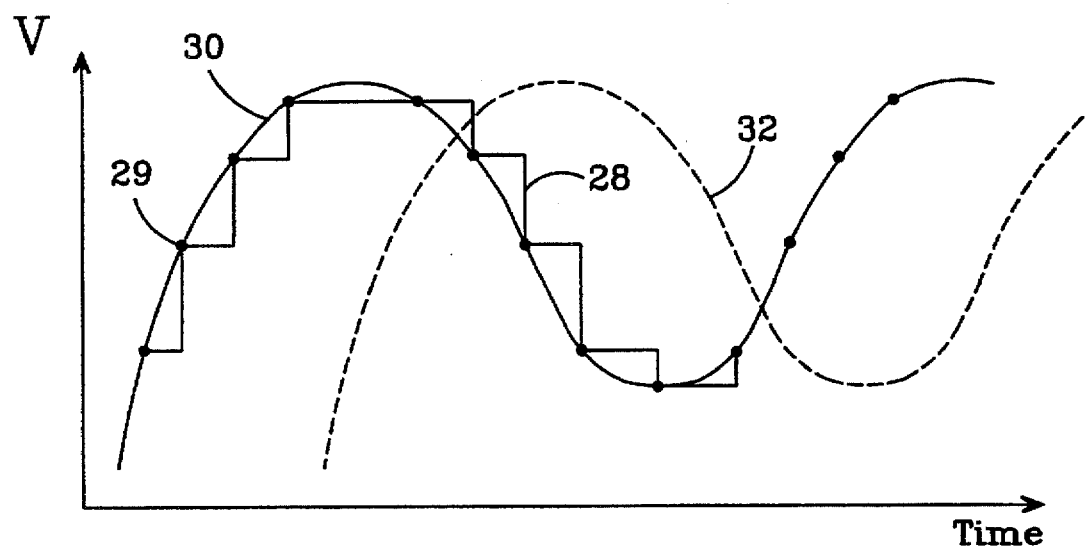
FIG. 2, described above, is a plot of an analog waveform and the ideal stair-stepped output of the DAC shown in FIG. 1.
Figure 3:
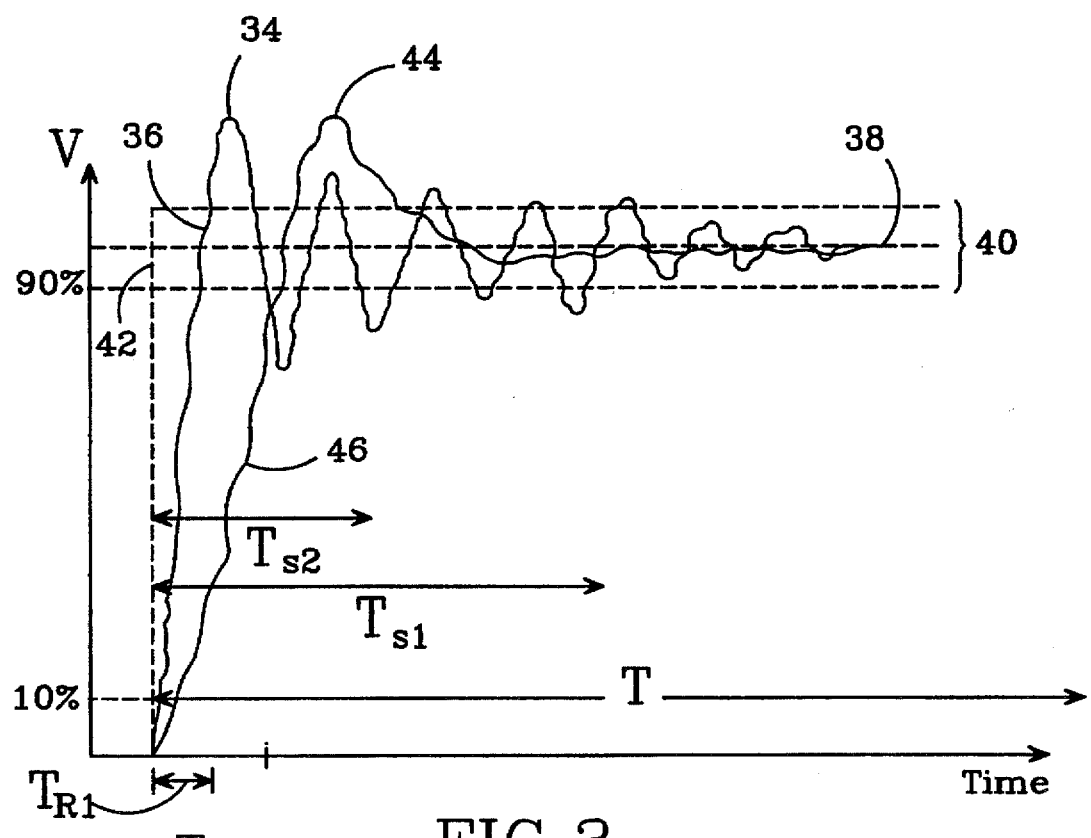
FIG. 3, described above, is a plot of the rising edge and plateau for a ZOH waveform for two known DACs.
Figure 4:
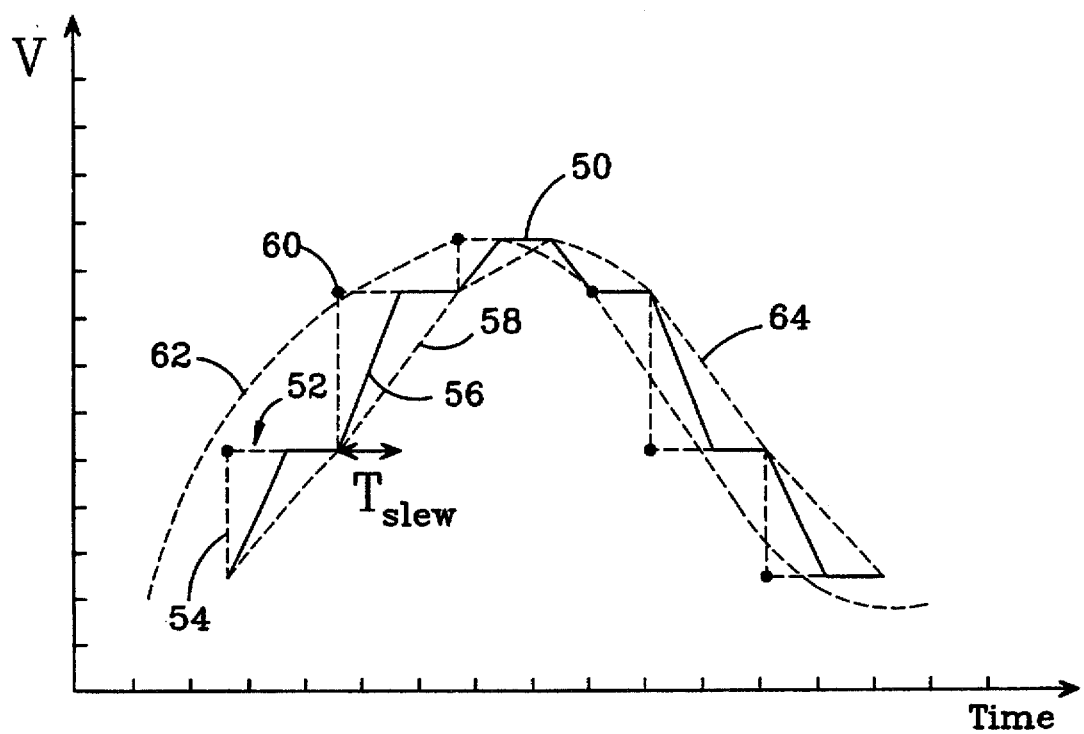
FIG. 4 is a plot of an approximately piecewise linear analog waveform in accordance with the present invention.

The applicant has found that the frequency response and SQNR of a DAC can be improved by designing it to produce an analog voltage signal that approximates a piecewise linear analog waveform 50, as shown in FIG. 4, instead of a ZOH waveform 52. Alternatively, the DAC could output an analog current signal. Piecewise linear waveform 50 is composed of linear ramps 56 that connect plateaus 58, which correspond to the values of successive quantized samples 60 from an underlying analog waveform 62. The preferred waveform 50 has equal rise and fall times, designated $T_{slew}$. Thus, the slope (slew rate) of each linear ramp is the ratio of the difference between successive plateaus 58 and slew time $T_{slew}$. As shown, $T_{slew}$ is 50% of the clock period T. As $T_{slew}$ goes to zero percent, the piecewise linear waveform converges to ZOH waveform 52. Conversely, as $T_{slew}$ goes to 100%, waveform 50 converges to a first-order-hold (FOH) waveform 64.

Figure 5:
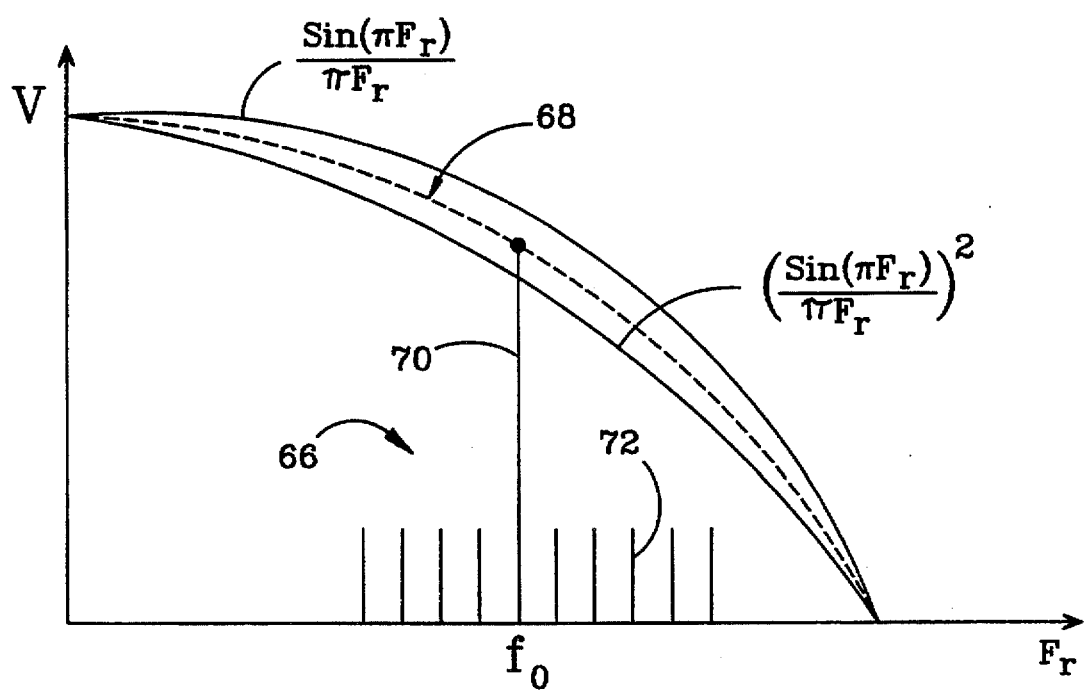
FIG. 5 is a plot of the frequency response and spectral envelopes for the ZOE and first order hold (FOH) waveforms.

FIG. 5 plots a DAC's frequency response 66 where the underlying waveform 62 (in FIG. 4) is a sinewave of frequency $f_0$. The envelope 68 of a DAC's frequency response 66 varies from $$\frac{\sin(\pi F_r)}{\pi F_r}$$

for ZOH waveform 52 to $$\left( \frac{\sin(\pi F_r)}{\pi F_r} \right)^2$$

for FOH waveform 64, where $F_r$ is a ratio of output frequency to clock frequency. Thus, in theory the piecewise linear waveform 50 is suboptimal when compared to ZOH waveform 52 because its frequency response rolls off faster, which means it will transfer less power to the output at any given frequency than the ZOH waveform.

Frequency response 66 includes a desired component 70 at the sinewave frequency and spurs 72 that represent the distortion in the analog voltage signal produced by the DAC. Spurs 72 will always exist due to quantization noise incurred when sampling analog waveform 62. However, if the DAC's analog output voltage signal exactly matches the ZOH or piecewise linear waveforms, spurs 72 will be approximately 6 dB per bit less than component 70.

Following this theory, prior DACs generate voltage signals that try to approximate ZOH waveform 52 as closely as possible. However, in practice the applicant has found that by sacrificing some power efficiency a DAC can be designed and controlled to produce an analog voltage signal that approximates the piecewise linear waveform 50 better than prior DACs can approximate ZOH waveform 52. This reduces the magnitude of spurs 72 and hence improves the DAC's spectral distortion characteristics and SQNR.

Figure 6:
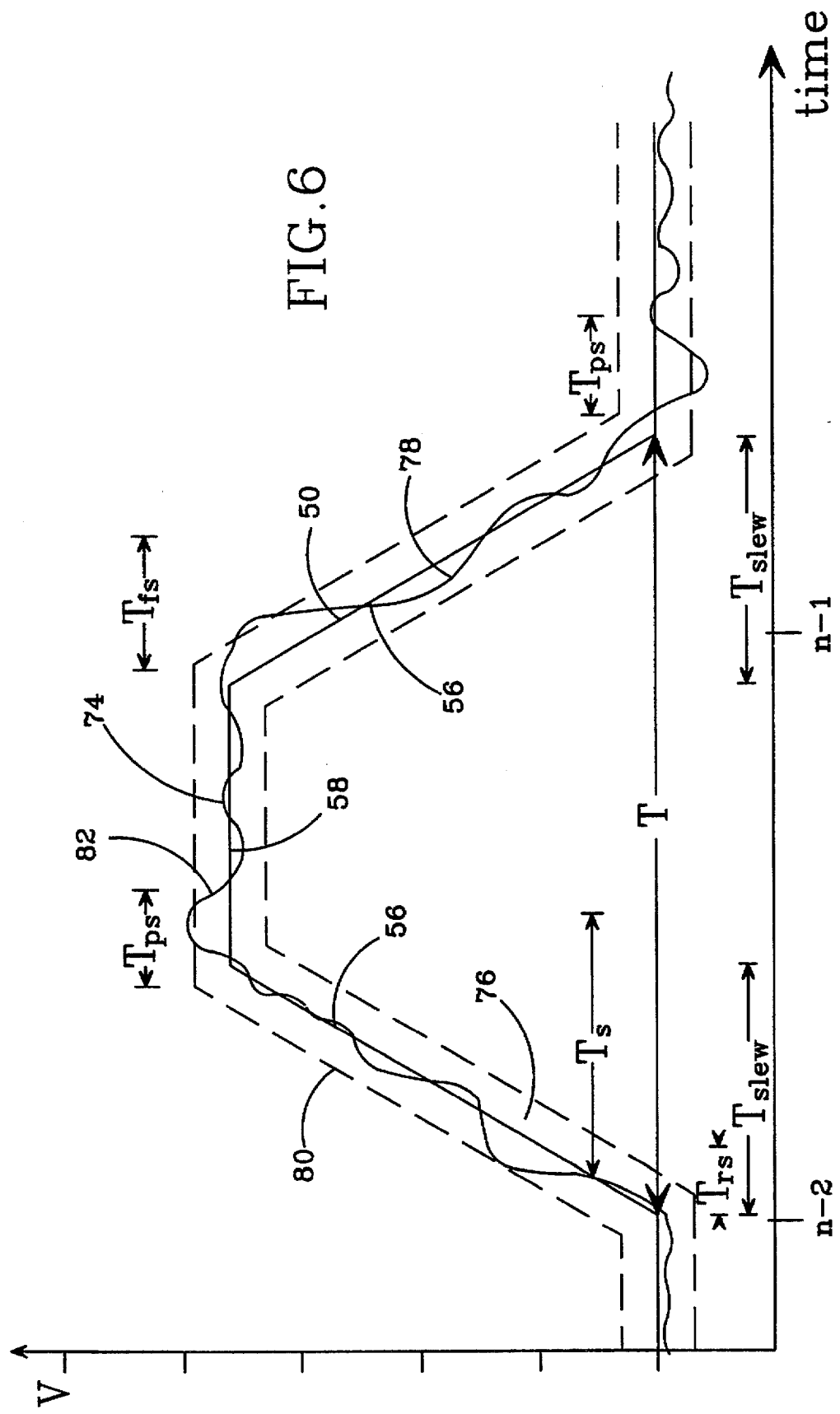
FIG. 6 is a plot of the DAC's analog output voltage signal.

As shown in FIG. 6, a DAC embodying the present invention generates an analog output voltage signal 74 that closely follows the approximately piecewise linear waveform 50. Voltage signal 74 has rising and falling edges 76 and 78 that settle to within a desired error bound 80 (suitably one-half an LSB) of linear ramps 56, and plateaus 82 that settle to within the desired error bound of plateaus 58. The rise and fall settling times $T_{rs}$ and $T_{fs}$ are measured from the beginning of each clock cycle and the plateau settling time $T_{ps}$ is measured from the end of slew time $T_{slew}$. The settling time $T_s$ is measured from the beginning of each clock cycle to the point where plateau 82 settles to within the error bound. Whereas prior DACs only settle once to the desired plateau level, voltage signal 74 settles twice during each clock period to piecewise linear waveform 50. This increases the amount of time that voltage signal 74 accurately represents the desired waveform 50, which results in lower distortion and increased SQNR. Thus, distortion is reduced by reducing the sums $T_{ps}$ and $T_{ps}+T_{fs}$ so that they are less than a desired portion of the clock period, e.g. 50%.

The settling times $T_{rs}$, $T_{fs}$ and $T_{ps}$ are reduced by increasing the slew time $T_{slew}$. This reduces the slew rate, which reduces the amount of overshoot and suppresses ringing. Also, a lower slew rate reduces the high frequency content of rising and falling edges 76 and 78 so that parasitic effects are reduced and the edges converge to linear ramps 56. At a 100% slew rate the settling times would be minimized, but voltage signal 74 would at most obtain the desired plateau for an instant at the end of each clock period. If voltage signal 74 is skewed, it may never reach the desired value. For this reason, and because the envelope of the frequency response rolls off as $T_{slew}$ is increased, $T_{slew}$ is preferably set to between approximately 25% and 90% of settling time $T_s$ to reduce the distortion in voltage signal 74 while maintaining adequate power efficiency. At clock rates in the GHz range such as found in data conversion applications, $T_s \approx T$. At low clock rates in the KHz range such as in audio applications or in the MHz range such as in video systems, $T_s < T$. It is not known whether reducing $T_{slew}$ to this extent will increase the settling time as measured in the prior DACs.

Figure 7:
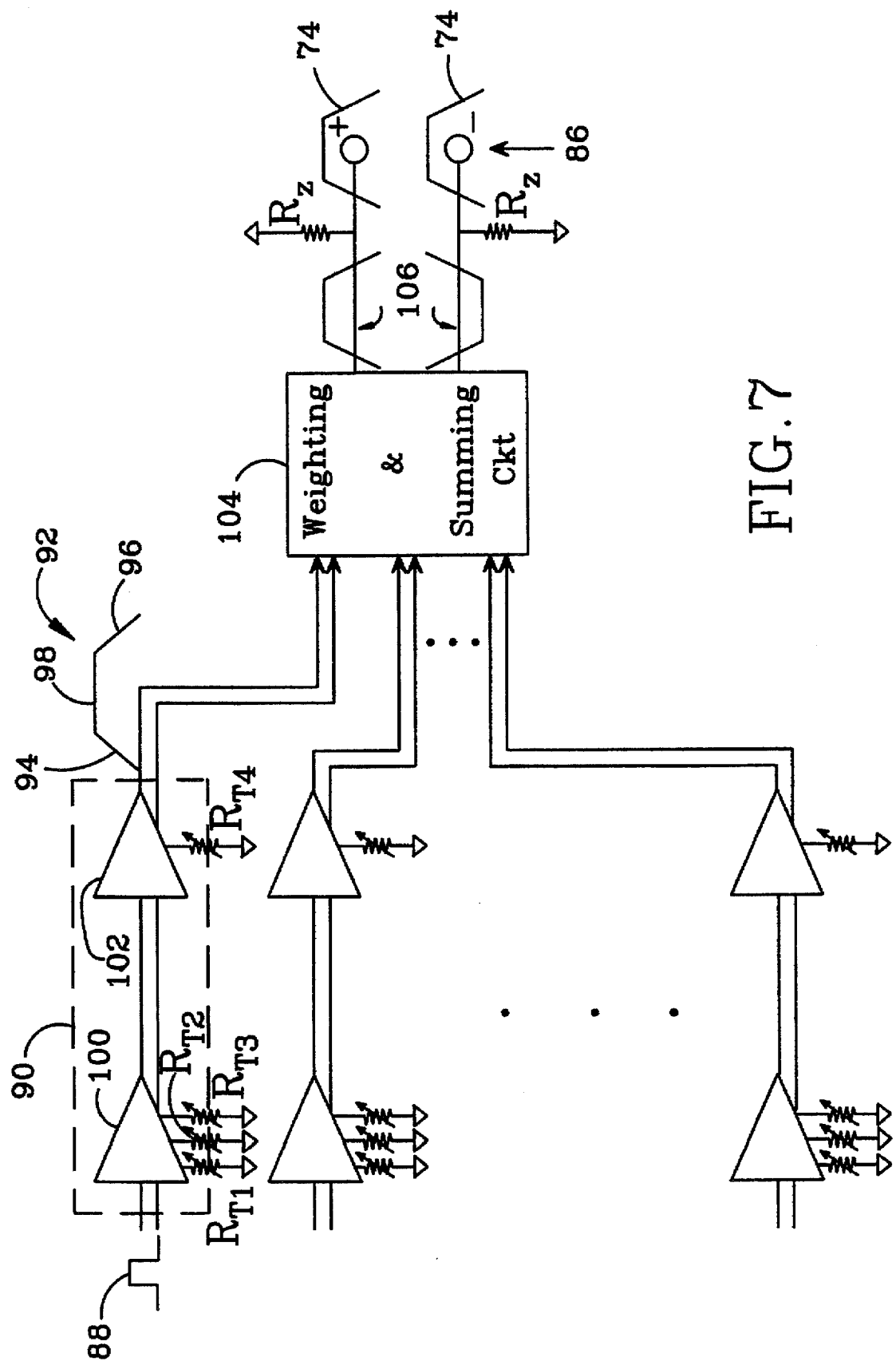
FIG. 7 is a block diagram of a DAC in accordance with the present invention.

FIG. 7 is a block diagram of a DAC 84 that produces the approximately piecewise linear voltage signal 74 at a differential output 86 in response to a sequence of n-bit digital codewords. Each codeword is represented by n digital signals 88 that are applied differentially to respective signal paths 90. The codewords can be binary, thermometer codes, or a hybrid binary/thermometer code. A thermometer code is formed by mapping an r-bit binary code into an $n=2^r-1$ bit code where the bits are equally weighted and turn on cumulatively like a thermometer. A thermometer code improves the accuracy of the DAC because the output signals from the signal paths can be summed together without binary weighting. However, a thermometer code requires substantially more circuitry. Thus, a hybrid binary/thermometer code that codes the MSBs with a thermometer code and the LSBs with a binary may be preferred.

Signal paths 90 generate approximately piecewise linear voltage signals 92 having rising and falling edges 94 and 96, respectively, that settle to within a desired error bound from a linear ramp, and having plateaus 98 that settle to within the error bound from an ideal value represented by that path's associated bit. Each signal path 90 includes a waveform shaping circuit 100 that controls the symmetry and slew time $T_{slew}$ of rising and falling edges 94 and 96. A limiting switch 102 precision limits plateaus 98 and maintains the linearity of the rising and falling edges by expanding its linear operating range.

Voltage signals 92 are applied to a weighting and current summing circuit 104 that converts them into current signals, weights the current signals as a function of the corresponding bit's significance, and sums them together to produce a differential output current 106. If the digital codeword is a binary code, circuit 104 includes a resistive network that binary weights and sums the current signals. The resistive network is preferably implemented with the well known R-2R ladder to improve the accuracy of the DAC. If the codeword is a thermometer code, voltage signals 92 are applied across a single resistor to sum the equally weighted current signals. A hybrid code uses a portion of the R-2R ladder (shown in detail in FIG. 11) to binary weight the binary LSBs and sum all of the current signals. Differential output current 106 flows through a pair of resistors $R_2$ to produce approximately piecewise linear voltage signal 74 at differential output 86.

DAC 84 is calibrated by externally trimming the waveform shaping circuits 100 and linear switches 102 until the rising and falling edges and plateaus of its analog voltage signal 74 settle to within the desired error bound 80 (shown in FIG. 6), are symmetric and have the correct duty cycle. To improve the accuracy of DAC 84, signal paths 90 are preferably calibrated independently by applying a high digital signal 88 to one signal path and low digital signals to all the other paths, and monitoring voltage signal 74. To ensure that the cumulative error is within one-half of an LSB, the individual waveforms will generally have to conform to a tighter error bound. One approach is to set the root-mean-square of the individual error bounds to equal one-half an LSB. Alternatively, the known differential and integral error measures can be used.

To calibrate DAC 84, waveform shaping circuits 100 have trimming circuits that are represented by trimming resistors $R_{T1}$, $R_{T2}$ and $R_{T3}$, and linear switches 102 have a trimming circuit that is represented by trimming resistor $R_{T4}$. Trimming $R_{T1}$ balances waveform shaping circuit 100 so that the rise and fall times of voltage signal 92 are symmetric. However, this causes voltage signal edges 94 and 96 to shift in time independently and change the signal's duty cycle. Therefore, the shaping circuits are precompensated to offset the relative time shift of 94 and 96 by trimming $R_{T2}$. Trimming $R_{T3}$ reduces the rise and fall times of voltage signal 92 until the rising and falling edges of the DAC's output voltage signal 74 settle to within the predetermined error bound from the linear ramp. These resistors are trimmed so that each signal path satisfies the error bound and preferably the rise and fall times for each waveform 92 are approximately equal. Trimming resistor $R_{T4}$ sets the high and low plateau levels to within the predetermined error bound from the ideal plateau levels, which are a function of the corresponding bits significance.

Figure 8:
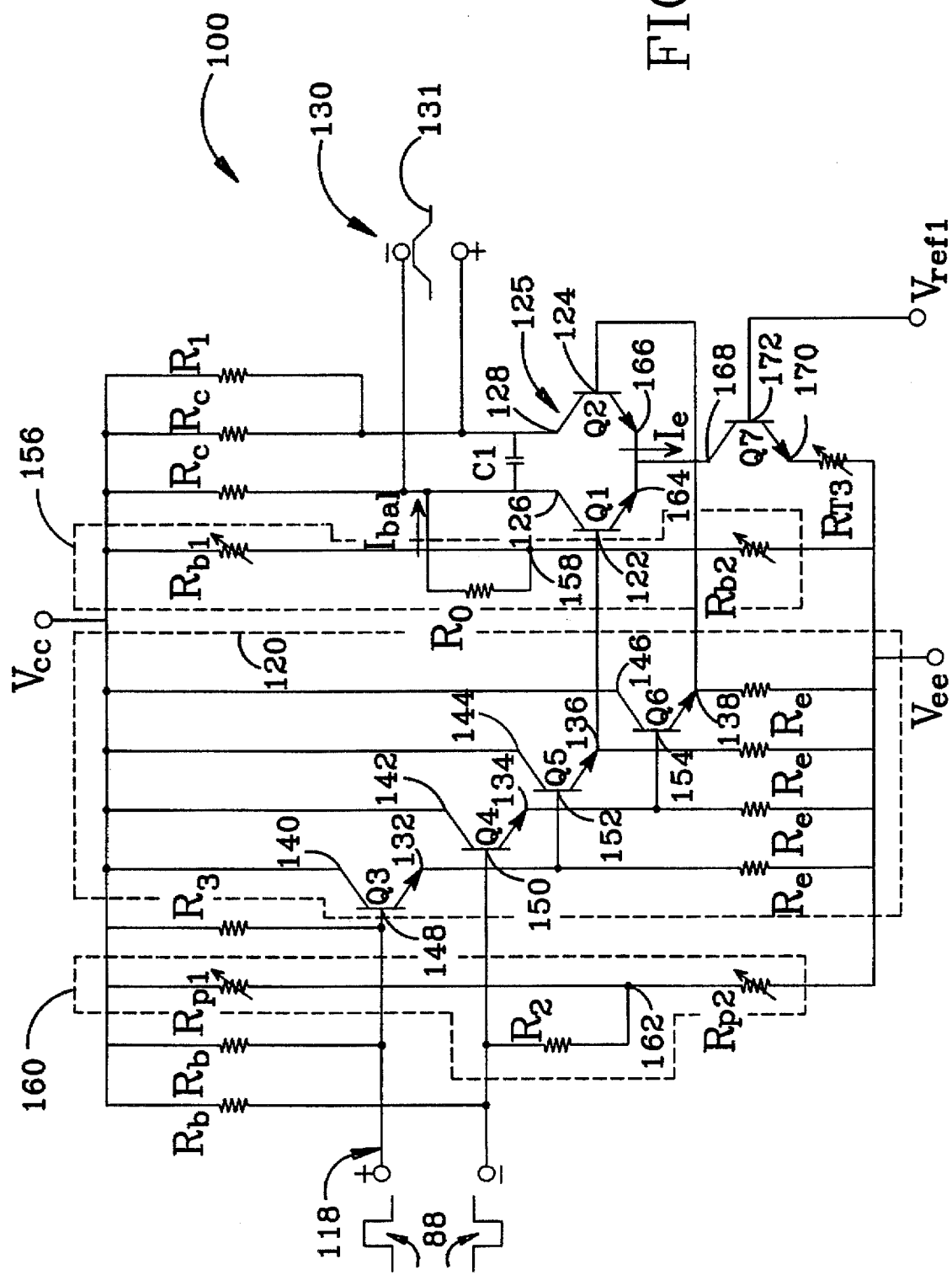
FIG. 8 is a schematic diagram of the waveform shaping circuit shown in FIG. 7.

FIG. 8 is a schematic diagram of waveform shaping circuit 100. Digital voltage signal 88 is applied to a differential input 118. A level shifting circuit 120 shifts voltage signal 88 and applies it to the bases 122 and 124 of an emitter-coupled pair 125 of npn transistors Q1 and Q2, respectively. Collectors 126 and 128 of transistors Q1 and Q2 are respectively connected to a differential output 130, and through bias resistors $R_c$ to a high supply voltage $V_{cc}$, suitably ground reference potential. When voltage signal 88 is high (low), transistor Q1 turns on (off) and Q2 turns off (on) so that the polarity of the voltage signal 131 at differential output 130 is 180° out of phase with respect to digital voltage signal 88. The high and low plateau values for voltage signal 131 are limited by the size of resistors $R_c$, typically 300 to 1K ohms, and the amount of emitter current $I_e$, typically 400 μA to 3 mA.

The rise and fall times of voltage signal 131 are increased by connecting a capacitor C1, suitably 400 pF, across collectors 126 and 128 of transistors Q1 and Q2, respectively. The size of capacitor C1 can be reduced by approximately a factor of one hundred by using a Miller multiplier, which increases the effective capacitance. Capacitor C1 resists switching the voltage across differential output 130, and hence increases the rise and fall times. The capacitance of C1 and emitter current $I_e$ are selected so that capacitor C1 charges and discharges between the limiting high and low plateau values in an approximately linear manner. If the capacitance is too large or the emitter current too small, the voltage across the capacitor will increase logarithmically and may never reach the desired plateau levels before the next clock cycle.

Level shifting circuit 120 comprises four NPN transistors Q3 through Q6 whose emitters 132 through 138 are connected through biasing resistors $R_e$ to a low voltage supply $V_{ee}$, suitably −5.2 V. Their collectors 140 through 146 are connected to the high supply voltage $V_{cc}$. Differential input 118 is connected to the bases 148 and 150 of transistors Q3 and Q4, respectively. Bases 148 and 150 are tied through bias resistors $R_b$ to the high voltage supply $V_{cc}$ to supply bias current to transistors Q3 and Q4 so that transistors Q3 through Q6 are always turned on. Emitters 132 and 134 of transistors Q3 and Q4 are connected to the bases 152 and 154 of transistors Q5 and Q6, respectively, and emitters 136 and 138 of transistors Q5 and Q6 are connected to bases 122 and 124 of emitter-coupled transistors Q1 and Q2, respectively. This level shifts digital signal 88 down by two npn transistor base-emitter voltage drops so that it is compatible with driving emitter-coupled pair 125.

Figure 9:
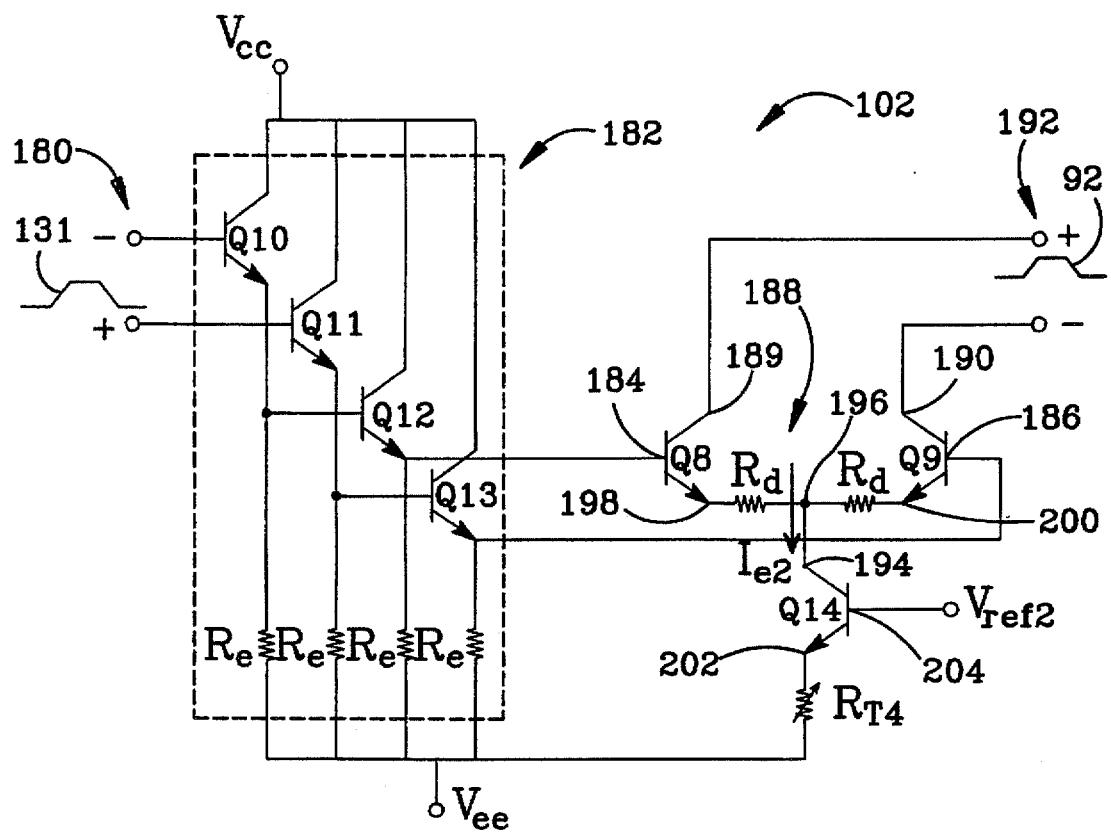
FIG. 9 is a schematic diagram of the limiting switch shown in FIG. 7.

A balancing circuit 156 (shown as trimming resistor $R_{T1}$ in FIG. 7) offsets voltage signal 131 to precompensate the signal path for the asymmetry of an emitter-coupled pair 188 of transistors Q8 and Q9 in limiting switch 102 (shown in FIG. 9). Transistor Q1's collector current, which remains approximately constant, is supplied through its collector resistor $R_c$ and balancing circuit 156. Balancing circuit 156 supplies and sinks current $I_{bal}$ from resistor $R_c$ to pull the voltage at collector 126 up and down, respectively, so that transistors Q8 and Q9 effectively switch at the same threshold voltage so that voltage signal 92 is symmetric. Balancing circuit 156 includes trimming resistors $R_{b1}$ and $R_{b2}$ that are connected in series between the low and high supply voltages $V_{ee}$ and $V_{cc}$ at node 158. A resistor $R_0$ is connected between collector 126 and node 154 to provide balancing current $I_{bal}$ to transistor Q1.

When the threshold voltage of transistor Q8 is higher than that of transistor Q9, Q8 turns on more slowly and turns off faster than transistor Q9. To balance the transistors, resistor $R_{b2}$ is trimmed so that the voltage at node 158 is higher than the voltage at collector 126. This causes $I_{bal}$ to supply a portion of transistor Q1's collector current so that the voltage at its collector 126 is increased. This causes transistor Q8 to turn on faster and turn off slower. Conversely, when the threshold voltage of transistor Q8 is lower than that of transistor Q9, resistor $R_{b1}$ is trimmed so that the voltage at node 158 is lower than the voltage at collector 126. This increases the current flowing through collector resistor $R_c$ and pulls the voltage at collector 126 down, which makes Q8 turn on slower and turn off faster. Resistors $R_{b1}$ and $R_{b2}$ are trimmed until the rise and fall times observed at the output of each signal path 90 are substantially the same.

Transistors Q1 and Q2 preferably switch between the same high and low voltage levels at their respective collectors. For this to occur, the equivalent resistance at collectors 126 end 128 must be the same. Therefore, a resistor $R_1$ is connected between the high voltage supply $V_{cc}$ and collector 128 of transistor Q2 so that it is in parallel with resistor $R_c$. The resistance of $R_1$ is selected so that it has the resistance of $R_0$ in series with the parallel combination of the nominal values for $R_{b1}$ and $R_{b2}$.

Balancing circuit 156 balances emitter-coupled pair 188 but also changes the duty cycle of voltage signal 92. To maintain synchronism between signal paths 90, a precompensation circuit 160 (shown as trimming resistor $R_{T2}$ in FIG. 7) shifts one side of the differentially applied digital voltage signal 88 by increasing or reducing the amount of base current supplied to base 150 of transistor Q4. Precompensation circuit 160 includes trimming resistors $R_{p1}$ and $R_{p2}$ that are connected in series between voltage supplies $V_{cc}$ and $V_{ee}$ at node 162. A resistor $R_2$ is connected between node 162 and base 150 and a resistor $R_3$ is connected between base 148 of transistor Q3 and high voltage supply $V_{cc}$. The resistance of $R_3$ is selected to be the resistance of $R_2$ in series with the parallel combination of the nominal values for $R_{p1}$ and $R_{p2}$. Resistors $R_{p1}$ and $R_{p2}$ are trimmed to move the voltage at node 162 above or below the voltage at base 150 to modify the base current as required to offset the skew caused by balancing circuit 156.

The symmetric rise and fall times of voltage signal 92, and hence the rise and fall times of the DAC's analog voltage signal, are set by adjusting the total tail current $I_e$ drawn from emitters 164 and 166 of emitter-coupled transistors Q1 and Q2, respectively. When emitter-coupled pair 125 switches in response to digital signal 88, the polarity of tail current $I_e$ switches with respect to capacitor C1 so that it charges or discharges capacitor C1. Reducing tail current $I_e$ slows the response of capacitor C1 which increases the rise and fall times.

To control tail current $I_e$, emitters 164 and 166 are connected to the collector 168 of an npn transistor Q7 whose emitter 170 is connected through trimming resistor $R_{T3}$ to low voltage supply $V_{ee}$. A reference voltage $V_{ref1}$ is applied to the base 172 of transistor Q7 so that it supplies tail current $I_e$. Resistor $R_{T3}$ is trimmed until the symmetric rise and fall times are increased to the point that the rising and falling edges of the DAC's analog voltage signal settle to within the desired error bound of the linear ramp. Furthermore, the resistors $R_{T2}$ in each signal path 90 are preferably trimmed so that the rise and fall times associated with each signal path are substantially the same.

FIG. 9 is a schematic diagram of limiting switch 102. Voltage signal 131 is applied to limiting switch 102 at a differential input 180. A level shifting circuit 182 shifts voltage signal 131 and applies it to the bases 184 and 186 of the emitter-coupled pair 188 of NPN transistors Q8 and Q9, respectively. Level shifting circuit 182 includes transistors Q10 through Q13 and respective emitter biasing resistors $R_e$ that are connected in the same manner as level shifting circuit 120 (shown in FIG. 8).

Emitter-coupled pair 188 produces voltage signal 92 differentially across its collectors 189 and 190 at differential output 192. The high and low plateau levels of voltage signal 92 are precision limited by adjusting the total emitter current $I_{e2}$ supplied by emitter-coupled pair 188. This is done by connecting collector 194 of a transistor Q14 to a common emitter junction 196 between the emitters 198 and 200 of transistors Q8 and Q9, respectively. Transistor Q14's emitter 202 is connected through the trimmable resistor $R_{T4}$ to the low supply voltage $V_{ee}$, and its base 204 is connected to a reference voltage $V_{ref2}$. Resistor $R_{T4}$ is trimmed until the plateau values for the DAC's analog voltage signal are within one-half a LSB of the ideal values represented by the digital codewords.

Figure 10:
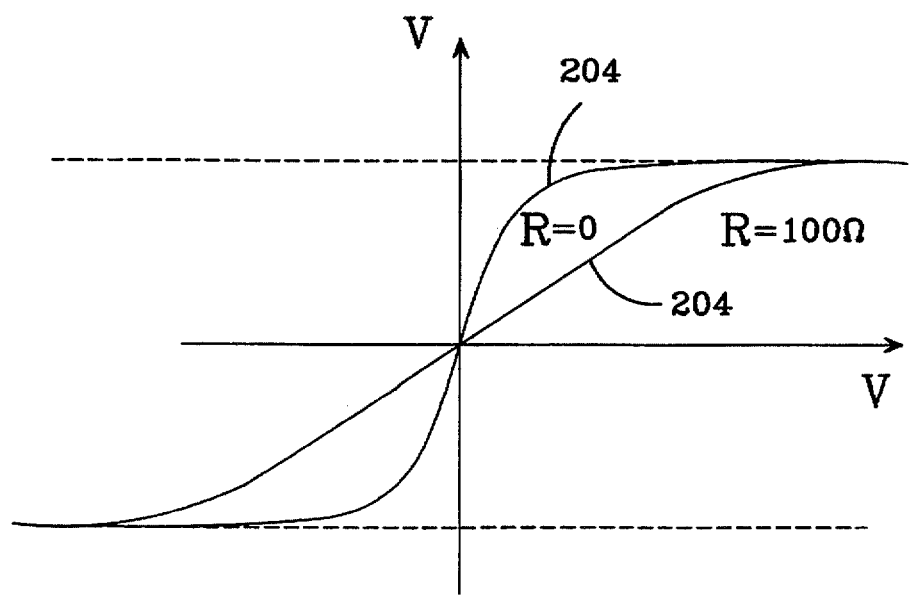
FIG. 10 is a plot of the output voltage versus the input voltage for the limiting switch shown in FIG. 9.

To maintain the linearity of the voltage signal's rising and falling edges that was established by the waveform shaping circuit, the range of input voltages over which emitter-coupled pair 188 behaves approximately as a linear amplifier is increased. This can be accomplished in a number of ways, such as by using emitter degeneration resistors or scaled parallel transistors. As shown, emitter degeneration resistors $R_d$, typically less than approximately 100 ohms, are connected between junction 196 and emitters 198 and 200 of transistors Q8 and Q9. As shown in FIG. 10, this extends the linear range of the emitter coupled pair's transfer function 204 by an amount approximately equal to $I_{e2}R_d$.

Figure 11:
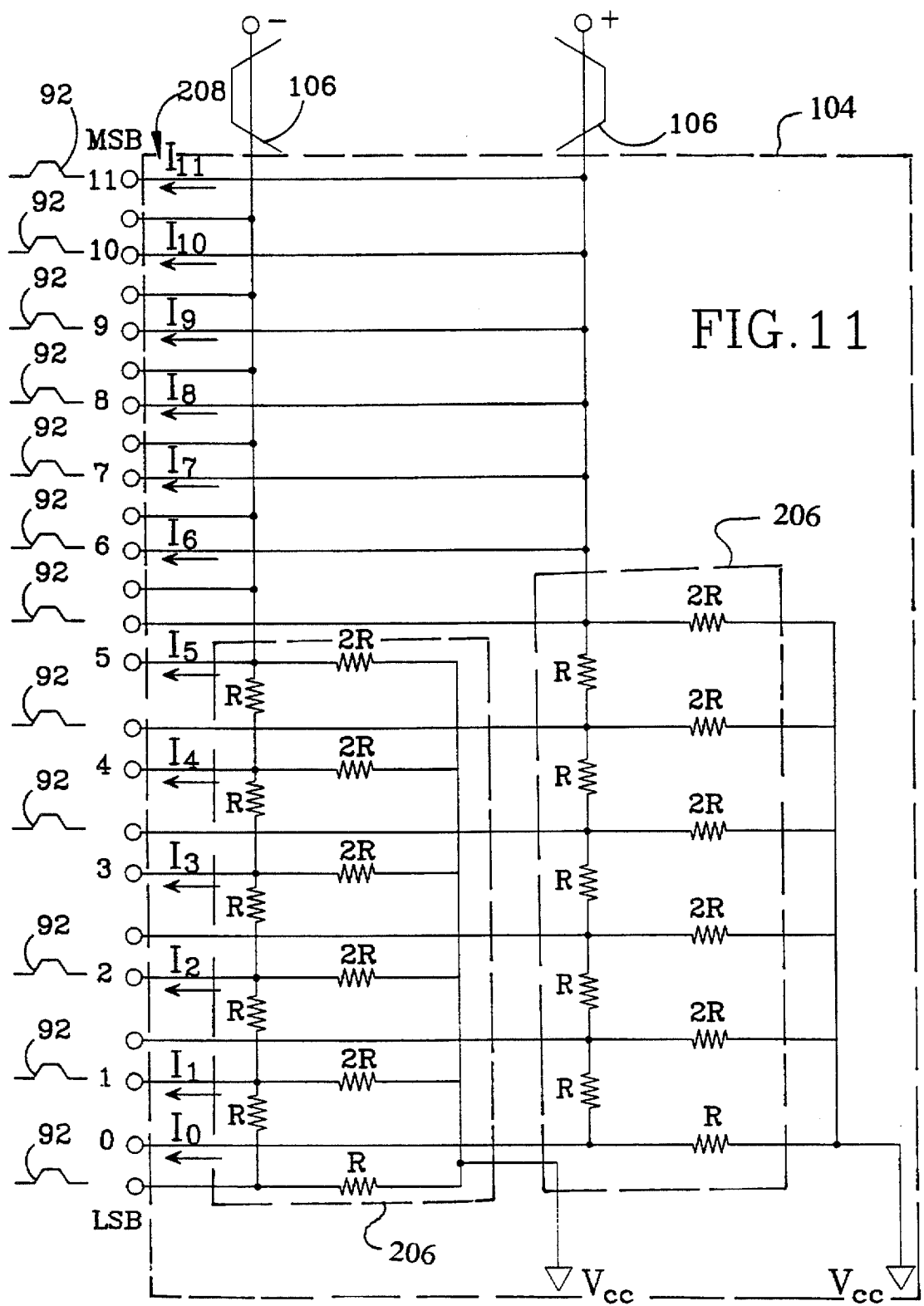
FIG. 11 is a schematic diagram of a preferred embodiment of the weighting and current summing circuit shown in FIG. 7.

FIG. 11 is a preferred embodiment of weighting and summing circuit 104 that includes a pair of well known R-2R ladders 206. Voltage signals 92 from signal paths 90 are applied differentially to respective nodes 208. As shown, the codeword is a 12 bit hybrid binary/thermometer code, which is formed from an 8 bit binary code by mapping its five LSBs directly into the five LSBs in the hybrid code. The binary code's 3 MSBs are mapped into 7 equally weighted bits in the hybrid code. The weight of each of these seven bits is equivalent to the sixth bit in the binary code.

The equivalent resistance of R-2R ladders 206 at nodes 5 through 11 is R so that the current signals $I_5$ through $I_{11}$, which correspond to the thermometer coded bits, are equally weighted. Ladders 206 divide current signals $I_4$-$I_0$ so that the proper binary fraction of each current signal is provided to the output. The current signals at each node 208 are summed together to produce differential current signal 106, which is proportional to the digital codewords input to the DAC.

Figure 12:
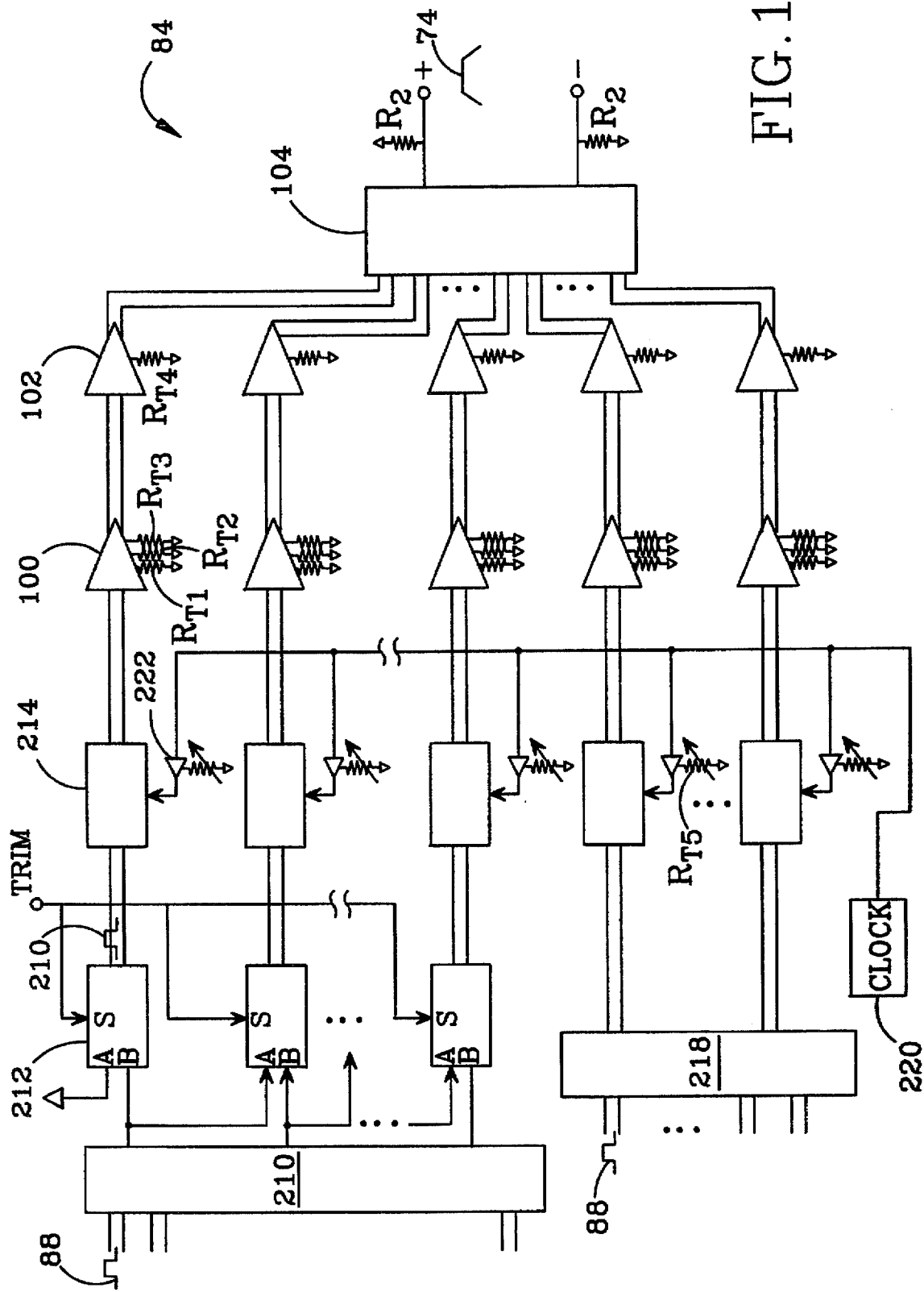
FIG. 12 is a block diagram of a preferred embodiment of the DAC shown in FIG. 7.

FIG. 12 is a block diagram of a preferred embodiment of DAC 84. The circuitry of DAC 84 shown in FIG. 7 is expanded to include a recoder 210 that maps an m bit binary code into a n bit hybrid binary/thermometer code, calibration selection circuits 212 that allow independent calibration of signal paths 90, and latch circuits 214 that resynchronize digital signals 88 before they are applied to waveform shaping circuits 100 and linear switches 102.

The m bit binary codeword is split into its m-w MSBs that are mapped into $2^{m-w}-1$ equally weighted bits in the hybrid codeword, and its w LSBs that are mapped into the w binary weighted LSBs in the hybrid codeword. Thus, DAC 84 has n signal paths 90 where $n=2^{m-w}-1+w$. Digital signals 88 corresponding to the m-w MSBs of the binary codeword are applied to a recoder 210 that maps them into the $2^{m-w}-1$ thermometer coded digital signals 88.

The thermometer coded digital signals 88 are input to their respective calibration selection circuits 212 and to the selection circuit 212 that corresponds to the next lower bit. The second input to the MSB's selection circuit is connected to ground. In normal operation, a selection disable command is applied to an external input (TRIM) so that selection circuits 212 pass digital signals 88 through to their respective latches 214.

Digital signals 88 that correspond to the w LSBs in the binary codeword are input to a delay circuit 218 that delays the application of those signals to their respective latches 214 by an amount of time approximately equal to the delay caused by recoder 210 and calibration selection circuits 212.

Recoder 210, selection circuits 212 and delay circuit 218 skew digital signals 88 relative to each other. To eliminate the skew, digital signals 88 are applied to latches 214 in each signal path 90. A clock 220 applies a clock signal to latches 214, which resynchronizes digital signals 88 and applies them to waveform shaping circuits 100 at the next clock cycle. The clock signal itself may be skewed by the circuitry. Delays 222 are used to improve the synchronization, and are adjusted by externally trimming resistors $R_{TS}$.

As described above, DAC 84 is preferably calibrated by calibrating each signal path 90 independently. Signal paths 90 that correspond to the binary code are isolated by manipulating the codeword to have only a single high bit. When enabled through the external input (TRIM), calibration selection circuits 212 isolate one of the signal paths 90 that correspond to the thermometer coded bits. Selection circuits 212 include logic circuitry that implements the truth table shown in table 1 below so that only the highest bit that would be turned on in normal operation is turned on during calibration. In table 1, the symbol E indicates an input code AB that is not possible. Alternatively, selections circuits 212 could be removed and voltage signal 74 calibrated by incrementing the digital codewords.

TABLE 1

| | | AB | | | |
|---|---|---|---|---|---|
| | | 00 | 01 | 11 | 10 |
| S | 0 | 0 | 1 | 1 | E |
| | 1 | 0 | 1 | 0 | E |

While several illustrative embodiments of the invention have been shown and described, numerous variations and alternate embodiment will occur to those skilled in the art. For example, pnp transistors could be used instead of the npn devices shown, and the circuits reconfigured for biasing between a positive $V_{cc}$ and grounded $V_{ee}$. Such variations and alternate embodiments are contemplated, and can be made without departing from the spirit and scope of the invention as defined in the appended claims.

I claim:

1. A digital-to-analog converter (DAC), comprising:
    a plurality of waveform shaping circuits that produce drive signals that switch during rise and fall times along rising and falling edges, respectively, between low and high plateaus in response to a sequence of n-bit codewords in which each bit controls a digital signal that is applied to one of the waveform shaping circuits for a known clock period;
    a plurality of limiting switches having transfer functions that limit the drive signals' low and high plateau values to low and high limiting values, respectively, while approximately maintaining the shape of the rising and falling edges;
    a weighting circuit that weights the drive signals in accordance with their respective bits' positions in the codewords to produce weighted drive signals; and
    a summation circuit that sums the weighted drive signals to construct an analog waveform having output plateau values and rising and falling output edges,
    said waveform shaping circuits setting said rise and fall times so that the rising and falling output edges settle in rise and fall settling times $T_{rs}$ and $T_{fs}$, respectively, measured from successive clock edges of said digital signal to within a first error bound of a linear output ramp whose slope is a function of the difference between successive codewords, and said limiting switches setting the low and high limiting values so that the output plateau values settle in a settling time $T_{ps}$ measured from the end of said rise and fall times to within a second error bound of ideal values represented by the codewords so that the analog waveform more closely approximates a piecewise linear waveform, which has non-zero rise and fall times, than it does a zero-order-hold (ZOH) waveform to reduce spectral distortion in the analog waveform.

2. The DAC of claim 1, wherein said plateaus settle to within said second error bound in a settling time $T_s$ that is measured from successive clock edges of said digital signal, said waveform shaping circuits setting the rise and fall times to reduce the respective sum of settling times $T_{ps}$ and $T_{rs}$ and settling times $T_{ps}$ and $T_{fs}$ and to increase the settling time $T_s$ beyond a minimum value thereby increasing the amount of time that the analog waveform lies within the first and second error bounds of the piecewise linear waveform to reduce spectral distortion.

3. The DAC of claim 2, wherein said waveform shaping circuits set said rise and fall times to be at least twenty-five percent of said settling time $T_s$.

4. The DAC of claim 1, wherein said waveform shaping circuits set said rise and fall times to be approximately the same.

5. The DAC of claim 1, wherein said first and second error bounds are approximately the same.

6. The DAC of claim 5, wherein said codewords have a least significant bit (LSB) that corresponds to a quantization resolution boundary, said first and second error bounds being at most said quantization resolution boundary.

7. The DAC of claim 6, wherein said first and second error bounds are approximately one-half said LSB.

8. The DAC of claim 1, wherein each of said waveform shaping circuits comprises:
a first pair of differentially connected transistors having a differential input that responds to the waveform shaping circuit's associated digital signal, a common tail current, and a differential output;
a capacitor that is connected across said differential output to produce said drive signal; and
a current source that supplies the common tail current at a level that charges and discharges the capacitor slowly enough to produce the drive signals' rising and falling output edges, respectively, that settle to within said first error bound of said linear output ramp.

9. The DAC of claim 8, wherein each of said limiting switches comprises:
a second pair of differentially connected transistors that switch a differential output between the low and high limiting values in response to the switch's drive signal, said second pair of transistors exhibiting a linear operating range while switching between the limiting values;
a current source that sets an amount of common tail current that flows through said second pair of transistors so that the limiting values are within said second error bound of the codewords' ideal values; and
a linearization circuit that expands the linear operating range so that the shape of the rising and falling edges are approximately maintained.

10. The DAC of claim 9, wherein said second pair of transistors are bipolar transistors having emitters, bases and collectors, said linearization circuit comprising a pair of emitter degeneration resistors that are connected between the respective transistors' emitters and said current source.

11. The DAC of claim 9, further comprising:
a balancing circuit that balances the second pair of differentially connected transistors by offsetting the value of said drive signal so that said rise and fall times are substantially the same.

12. The DAC of claim 11, wherein said balancing circuit also shifts the rising and falling edges in time, said DAC further comprising:
a compensation circuit that substantially offsets the time shift of the rising and falling edges caused by the balancing circuit by shifting the value of said digital signal.

13. The DAC of claim 1, wherein said n-bit codewords have w least significant bits (LSBs) that represent a digital code and q most significant bits (MSBs) that represent a thermometer code where the q MSBs turn on cumulatively, the DAC further comprising:
a recoder that receives a sequence of m-bit codewords having w LSBs and m-w MSBs, maps the w LSBs into the w LSBs of the n-bit codewords, and maps the m-w MSBs into the n-bit codewords' q MSBs, where $q=2^{m-w}-1$.

14. The DAC of claim 13, wherein said waveform shaping circuits are externally trimmable to set the rise and fall times and said limiting switches are externally trimmable to set the low and high limiting values, said DAC further comprising:
a selection circuit having a pass mode in which the digital signals for the q bits of the thermometer code are applied to the respective waveform shaping circuits and a trim mode in which only the digital signal for the highest bit in the thermometer code that is turned on is applied to its waveform shaping circuit, so that each of said waveform shaping circuits and limiting switches can be trimmed independently.

15. The DAC of claim 1, further comprising:
a plurality of latches that receive a clocking signal having said known clock period and the respective bit's digital signal, and outputs the digital signal to the waveform shaping circuit at the next clock cycle; and
a plurality of delay circuits that synchronize the clock signals applied to each of said latches so that the digital signals applied to the waveform shaping circuits are substantially synchronized.

16. A digital-to-analog converter (DAC), comprising:
a plurality of waveform shaping circuits that produce drive signals that switch symmetrically along rising and falling edges during transition times between low and high plateaus in response to a sequence of n-bit codewords in which each bit controls a digital signal that is applied to one of the waveform shaping circuits for a known clock period;
a plurality of limiting switches having transfer functions that limit the drive signals' low and high plateau values to low and high limiting values, respectively, while approximately maintaining the shape of the rising and falling edges;
a weighting circuit that weights the drive signals in accordance with their respective bits' positions in the codewords to produce weighted drive signals; and
a summation circuit that sums the weighted drive signals to construct an analog waveform having output plateau values that settle in settling times $T_s$ and $T_{ps}$ measured from successive clock edges of said digital signal and the end of said transition time, respectively, to within a known error bound of ideal values represented by the codewords and having rising and falling output edges that settle in rise and fall settling times $T_{rs}$ and $T_{fs}$, respectively, measured from successive clock edges of said digital signal to within said known error bound of a linear output ramp whose slope is a function of the difference between successive codewords, said waveform shaping circuits setting the transition time to reduce the sum of settling times $T_{ps}$ and $T_{rs}$ and the sum of the settling times $T_{ps}$ and $T_{fs}$ so that the analog waveform approximates a piecewise linear analog waveform having non-zero rise and fall times over a substantial portion of the clock period to reduce spectral distortion in the analog waveform while allowing the settling time $T_s$ to increase thereby reducing the shaping circuits' switchings speed.

17. The DAC of claim 16, wherein said waveform shaping circuits set said transition period to be at least twenty-five percent of said settling time $T_s$.

18. A method for constructing an analog waveform from a sequence of digital codewords in which each bit in the codeword controls a digital signal having a known clock period, comprising:

producing a plurality of drive signals that switch during rise and fall times along rising and falling edges, respectively, between low and high plateaus in response to respective digital signals;

adjusting the drive signals' low and high plateaus to low and high limiting values, respectively, as a function of a limiting signal while approximately maintaining the shape of the rising and falling edges;

weighting the drive signals in accordance with their respective bits positions in the codewords;

summing the weighted drive signals to construct an analog waveform having output plateau values and rising and falling output edges that approximate a zero-order-hold (ZOH) waveform, said ZOH waveform having a frequency response for transferring power from the digital signals to the analog waveform;

trimming said rise and fall times so that the rising and falling output edges settle in rise and fall settling times $T_{rs}$ and $T_{fs}$, respectively, to within a first error bound of a linear output ramp whose slope is a function of the difference between successive codewords; and trimming said limiting signal so that the output plateau values settle in a settling time $T_{ps}$ to within a second error bound of ideal values represented by the codewords such that said analog waveform more closely approximates a piecewise linear analog waveform having non-zero rise and fall times than it does said ZOH waveform to reduce spectral distortion in said analog waveform even though said piecewise linear analog waveform has a frequency response that transfers power less efficiently than said ZOH waveform.

19. The method of claim 18, wherein trimming said rise time reduces the sum of settling times $T_{ps}$ and $T_{rs}$ and trimming the fall time reduces the sum of the settling times $T_{ps}$ and $T_{fs}$ to increase the amount of time that the analog waveform lies within the first and second error bounds of the piecewise linear waveform during each clock period to reduce spectral distortion.

20. The method of claim 19, wherein said plateaus settle to within said second error bound in a settling time $T_s$ that is measured from successive clock edges of said digital signal and said plateau settling time $T_{ps}$ is measured from the end of said rise and fall times, said rise and fall times are trimmed so that they are at least twenty-five percent of said settling time $T_s$, which is set beyond a minimum achievable settling time.

21. The method of claim 18, further comprising balancing the drive signals so that the rise and fall times are approximately the same.

22. A method of converting a digital signal that changes at a predetermined clock rate to an analog format, comprising, for each successive clock period:

generating a progressively more linear analog ramp signal that ramps over a time period less than a full clock period from approximately the value of the digital signal for the immediately preceding clock period to approximately the value of the digital signal for the current clock period and converges to a linear output ramp whose slope is a function of the difference between the digital signal's values for the immediately preceding and current clock periods; and limiting said analog ramp signal over the remainder of said clock period duration to a progressively more linear steady state signal that converges toward the value of the digital signal for the current clock period so that said analog ramp signal more closely approximates a piecewise linear waveform having non-zero rise and fall times over said clock period than it does a zero-order-hold (ZOH) waveform to reduce spectral distortion in the analog ramp signal.

23. The method of claim 22, wherein said ramp signal is limited to a progressively more linear steady state signal that has an initial nonlinearity substantially greater than the nonlinearity of said ramp signal immediately prior to limiting said ramp signal.

24. The method of claim 22, wherein said steady state signal converges to within an error bound of the value of the digital signal in a settling time $T_s$ that is measured from a leading edge of said current clock period, said time period being at least twenty-five percent of the duration of the settling time $T_s$.

* * * * *